(12) United States Patent
Wakiyama et al.

(10) Patent No.: US 12,269,052 B2
(45) Date of Patent: Apr. 8, 2025

(54) SUBSTRATE LIQUID PROCESSING APPARATUS AND LIQUID DISCHARGE EVALUATION METHOD

(71) Applicant: Tokyo Electron Limited, Tokyo (JP)

(72) Inventors: Terufumi Wakiyama, Koshi (JP); Yuichi Douki, Koshi (JP); Akinori Tanaka, Koshi (JP); Minoru Tashiro, Koshi (JP); Reo Kitayama, Koshi (JP); Shu Yamamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 966 days.

(21) Appl. No.: 17/179,551

(22) Filed: Feb. 19, 2021

(65) Prior Publication Data

US 2021/0260612 A1    Aug. 26, 2021

(30) Foreign Application Priority Data

Feb. 20, 2020    (JP) .................................. 2020-027414

(51) Int. Cl.

| | |
|---|---|
| *B05B 12/12* | (2006.01) |
| *B05B 3/16* | (2006.01) |
| *B05B 12/10* | (2006.01) |
| *B05D 1/02* | (2006.01) |

(52) U.S. Cl.
CPC ................ *B05B 12/12* (2013.01); *B05B 3/16* (2013.01); *B05B 12/10* (2013.01); *B05D 1/02* (2013.01)

(58) Field of Classification Search
None
See application file for complete search history.

(56) References Cited

U.S. PATENT DOCUMENTS

| | | | |
|---|---|---|---|
| 2014/0192839 A1* | 7/2014 | Lacroix | .................... G01K 7/01 374/178 |
| 2017/0292192 A1* | 10/2017 | Iwai | .................... C23C 18/1632 |
| 2018/0261472 A1 | 9/2018 | Miyazaki et al. | |

FOREIGN PATENT DOCUMENTS

| | | |
|---|---|---|
| CN | 101202211 A | 6/2008 |
| CN | 108568383 A | 9/2018 |
| JP | 2013251335 A | 12/2013 |
| KR | 10-2015-0112810 A | 10/2015 |

* cited by examiner

*Primary Examiner* — Erica S Lin
(74) *Attorney, Agent, or Firm* — Chrisman Gallo Tochtrop LLC

(57) ABSTRACT

A controller is configured to control a liquid supply to change a landing position of a liquid on a surface of a substrate continuously by discharging the liquid toward the surface of the substrate from a first liquid discharge nozzle while moving the first liquid discharge nozzle. The controller is also configured to derive discharge position deviation information of the liquid supply by comparing first temperature information based on a spot temperature measured by a temperature measurement device when the first liquid discharge nozzle is moved along a first nozzle path and second temperature information based on the spot temperature measured by the temperature measurement device when the first liquid discharge nozzle is moved along a second nozzle path which is different from the first nozzle path.

16 Claims, 4 Drawing Sheets

SUBSTRATE LIQUID PROCESSING APPARATUS AND LIQUID DISCHARGE EVALUATION METHOD

CROSS-REFERENCE TO RELATED APPLICATION

This application claims the benefit of Japanese Patent Application No. 2020-027414 filed on Feb. 20, 2020, the entire disclosures of which are incorporated herein by reference.

TECHNICAL FIELD

The various aspects and embodiments described herein pertain generally to a substrate liquid processing apparatus and a liquid discharge evaluation method.

BACKGROUND

There is known an apparatus configured to discharge a processing liquid toward a substrate from a nozzle while moving the nozzle (see, for example, Patent Document 1).

Patent Document 1: Japanese Patent Laid-open Publication No. 2013-251335

SUMMARY

In one exemplary embodiment, a substrate liquid processing apparatus includes a substrate holder configured to hold a substrate; a rotating device configured to rotate the substrate around a rotation axis; a liquid supply equipped with a first liquid discharge nozzle configured to discharge a liquid having a temperature different from a temperature of the substrate, and also equipped with a nozzle moving device configured to move the first liquid discharge nozzle; a temperature measurement device configured to measure a spot temperature which is at least one of a temperature of a specific spot on a surface of the substrate or a temperature of the liquid on the specific spot; and a controller configured to control the liquid supply to change a landing position of the liquid on the surface of the substrate continuously by discharging the liquid toward the surface of the substrate from the first liquid discharge nozzle while moving the first liquid discharge nozzle, the controller being also configured to derive discharge position deviation information of the liquid supply by comparing first temperature information based on the spot temperature measured by the temperature measurement device when the first liquid discharge nozzle is moved along a first nozzle path and second temperature information based on the spot temperature measured by the temperature measurement device when the first liquid discharge nozzle is moved along a second nozzle path which is different from the first nozzle path.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
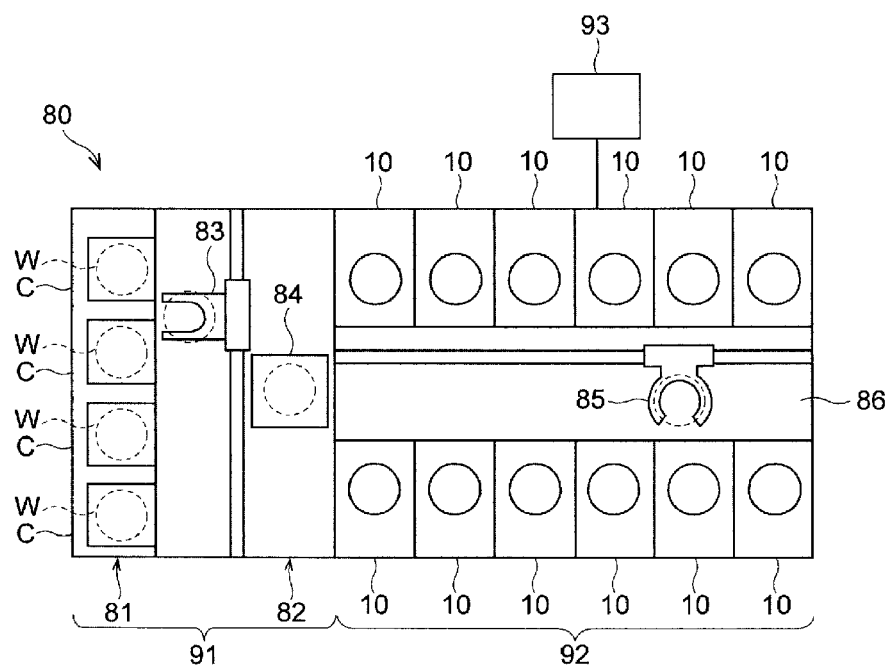
FIG. 1 is a diagram schematically illustrating an example of a processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a diagram schematically illustrating an example of a processing system 80. The processing system 80 shown in FIG. 1 is equipped with a carry-in/out station 91 and a processing station 92. The carry-in/out station 91 includes a placing section 81 equipped with a multiple number of carriers C; and a transfer section 82 equipped with a first transfer device 83 and a delivery unit 84. A plurality of substrates W is horizontally accommodated in each carrier C. The processing station 92 includes a multiple number of processing units 10 arranged at both sides of a transfer path 86; and a second transfer device 85 configured to be moved back and forth along the transfer path 86.

A substrate W is taken out from the carrier C and transferred to the delivery unit 84 by the first transfer device 83, and then taken out from the delivery unit 84 by the second transfer device 85. The substrate W is then carried into a corresponding processing unit 10 by the second transfer device 85, and a preset liquid processing (for example, a plating processing) is performed in the corresponding processing unit 10. Thereafter, the substrate W is taken out from the corresponding processing unit 10 and transferred into the delivery unit 84 by the second transfer device 85, and then returned back into the carrier C of the placing section 81 by the first transfer device 83.

The processing system 80 is equipped with a controller 93. The controller 93 is implemented by, for example, a computer, and is equipped with an operation processor and a storage. Programs and data for various processings performed in the processing system 80 are stored in the storage of the controller 93. The operation processor of the controller 93 controls the various kinds of devices of the processing system 80 by reading out and executing the programs stored in the storage appropriately, thus allowing the various processings to be performed.

The programs and the data stored in the storage of the controller 93 may be recorded in a computer-readable recording medium and may be installed from this recording medium to the storage. The computer-readable recording medium may be, by way of non-limiting example, a hard disk (HD), a flexible disk (FD), a compact disk (CD), a magnet optical disk (MO), a memory card, or the like.

Figure 2:
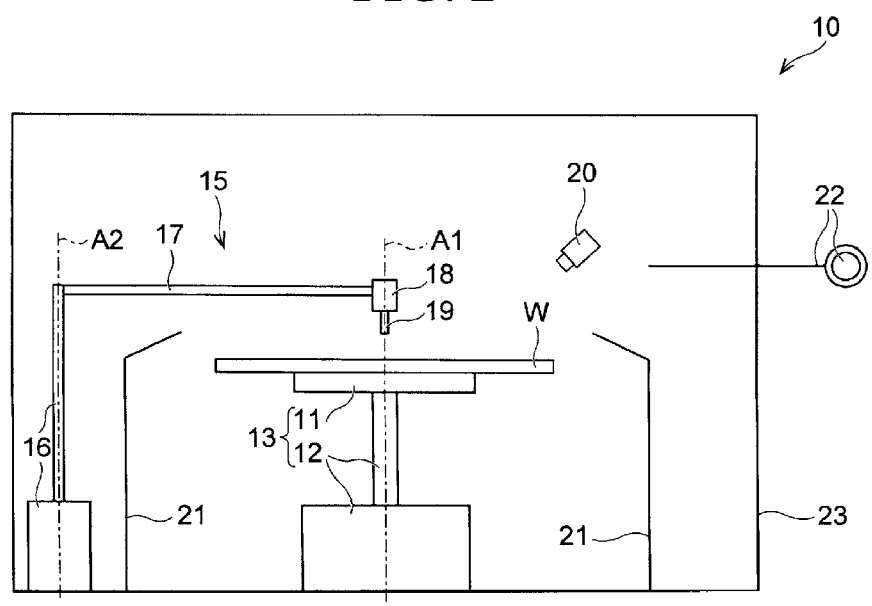
FIG. 2 is a diagram schematically illustrating an example of a processing unit.

FIG. 2 is a diagram schematically illustrating an example of the processing unit 10.

The processing units 10 constitute a substrate liquid processing apparatus along with the controller 93 (see FIG. 1). Each processing unit 10 is equipped with a substrate holder 11, a rotational driving unit 12, a liquid supply 15, a temperature measurement device 20, a cup body 21, an inert gas supply 22 and a processing chamber 23. The substrate holder 11, the rotational driving unit 12, the liquid supply 15, the temperature measurement device 20 and the cup body 21 are disposed inside the processing chamber 23. The inter gas supply 22 is configured to supply an inert gas (for example, a nitrogen gas) into the processing chamber 23.

The substrate holder 11 holds the substrate W transferred via the second transfer device 85 (see FIG. 1). Although the substrate holder 11 in the shown example adopts a vacuum-attraction mechanism of attracting and holding a rear surface of the substrate W, the substrate holder 11 may hold the substrate W by using any of various other types of mechanisms (for example, a mechanical chuck type). The rotational driving unit 12 is configured to apply a rotational moving force to the substrate holder 11, thus allowing the substrate W held by the substrate holder 11 to be rotated along with the substrate holder 11. The rotational driving unit 12 in the shown example includes a rotational driving shaft extending on a rotation axis A1 and having a leading end on which the substrate holder 11 is fixed; and a rotational driving main body configured to rotate the rotation driving shaft around the rotation axis A1. As stated, in the shown example, the substrate holder 11 and the rotational driving unit 12 constitute at least a part of a rotating device 13 which is configured to rotate the substrate W around the rotation axis A1.

The liquid supply 15 is equipped with a nozzle driving unit 16, a driving arm 17, a discharge head 18 and a liquid discharge nozzle 19. The nozzle driving unit 16 is equipped with a revolution driving shaft extending on a revolving axis A2 and having a leading end to which the driving arm 17 is fixed; and a revolution driving main body configured to rotate the revolution driving shaft around the revolving axis A2. The revolution driving shaft of the nozzle driving unit 16 is mounted to one end of the driving arm 17, and the discharge head 18 is mounted to the other end of the driving arm 17. The discharge head 18 is equipped with the liquid discharge nozzle 19. The liquid discharge nozzle 19 fixed to the driving arm 17 with the discharge head 18 therebetween is moved around the revolving axis A2 along with the driving arm 17 and the discharge head 18. In the shown example, the nozzle driving unit 16 and the driving arm 17 constitute at least a part of a nozzle moving device configured to move the liquid discharge nozzle 19.

The liquid discharge nozzle 19 discharges a liquid supplied from a liquid tank (not shown) via a liquid supply line (see a first liquid supply line 33*a* and a second liquid supply line 33*b* shown in FIG. 5 and FIG. 6 to be described later). The liquid supply line is led to the liquid discharge nozzle 19 through the driving arm 17 and the discharge head 18, and is equipped with a device such as a valve configured to control a flow of the liquid within the liquid supply line under the control of the controller 93 (see FIG. 1).

The number of the liquid discharge nozzle 19 belonging to the liquid supply 15 is not particularly limited. Though only one liquid discharge nozzle 19 is illustrated in FIG. 2, the liquid supply 15 may be equipped with two or more liquid discharge nozzles 19 (see a first liquid discharge nozzle 19*a* and a second liquid discharge nozzle 19*b* shown in FIG. 5 and FIG. 6 to be described later). As an example, the discharge head 18 may be equipped with a liquid discharge nozzle configured to discharge a processing liquid such as a plating liquid, a liquid discharge nozzle configured to discharge a rinse liquid such as pure water (DIW), and a liquid discharge nozzle configured to discharge a cleaning liquid for use in cleaning of the substrate.

The liquid discharge nozzle 19 according to the present exemplary embodiment is configured to discharge a liquid having a temperature different from a temperature of the substrate W. That is, the liquid discharge nozzle 19 is capable of discharging a liquid having a temperature higher or lower than the temperature of the substrate W. The temperature of the substrate W is typically equal to a temperature within the processing chamber 23 (that is, an environment temperature). By way of example, when the environment temperature is a room temperature (5° C. to 35° C.), the liquid discharge nozzle 19 is capable of discharging a liquid having a temperature higher or lower than the room temperature. The way how to adjust the temperature of the liquid discharged from the liquid discharge nozzle 19 is not particularly limited. Typically, the temperature of the liquid discharged from the liquid discharge nozzle 19 can be adjusted by a temperature controller (for example, a heating device and/or a cooling device driven under the control of the controller 93) provided at the liquid tank and/or the liquid supply line connected to the liquid discharge nozzle 19.

The temperature measurement device 20 is configured to measure the temperature of the substrate W held by the substrate holder 11. Typically, the temperature measurement device 20 is a non-contact type temperature measurement device equipped with an infrared sensor, and measures a temperature of a surface (particularly, a top surface on which the liquid discharged from the liquid discharge nozzle 19 is provided) of the substrate W held by the substrate holder 11. More strictly, when the liquid is not provided on the surface of the substrate W, the temperature measurement device 20 measures the temperature of the surface of the substrate W, whereas if the liquid is provided on the surface (particularly, a measurement target point) of the substrate W, the temperature measurement device 20 measures the temperature of the liquid on the surface of the substrate W. The temperature measurement device 20 of the present exemplary embodiment measures a spot temperature, which is at least one of a temperature of a certain region (hereinafter, referred to as "specific spot") of the surface (top surface) of the substrate W or the temperature of the liquid on the specific spot. That is, when no liquid exists on the specific spot on the surface of the substrate W, the temperature measurement device 20 measures the temperature of the specific spot itself (that is, the substrate W itself) as the spot temperature. Meanwhile, when the liquid exists on the specific spot, the temperature measurement device 20 measures the temperature of the liquid on the specific spot as the spot temperature.

A measurement target of the temperature measurement device 20 may be only a part of the surface of the substrate W, or the entire surface of the substrate W. Only the specific spot on the top surface of the substrate W may be set as the measurement target, or a region of the top surface of the substrate W including the specific spot and wider than the specific spot may be set as the measurement target. In case that the temperature measurement device 20 measures the "region of the top surface of the substrate W including the specific spot and wider than the specific spot," the controller 93 may acquire the spot temperature by analyzing the measurement result of the temperature measurement device 20. The temperature measurement device 20 in the shown example is installed at a position which is not directly above the substrate W. However, the installation position for the temperature measurement device 20 is not limited thereto, and the temperature measurement device 20 may be disposed directly above the substrate W.

As will be described later, the temperature measurement device 20 acquires the spot temperature in the state that the substrate W is being rotated. Thus, a partial region of the substrate W forming the specific spot may change depending on a rotation state of the substrate W. That is, while "a partial region of the substrate W included in a measurement range of the temperature measurement device 20 corresponding to the specific spot" forms the specific spot, the partial region of the substrate W corresponding to this specific spot may change depending on the rotation state of the substrate W.

The cup body 21 has a ring-shaped plan shape and is disposed to surround the substrate W held by the substrate holder 11. The cup body 21 receives the liquid scattered from the substrate W and guides the received liquid into a drain duct (not shown), or rectifies a flow of a gas around the substrate W such that the gas is not diffused. A specific configuration of the cup body 21 is not particularly limited. By way of example, the cup body 21 may have a cup for mainly guiding the liquid and a cup for mainly rectifying the flow of the gas separately.

The processing unit 10 may be further equipped with other devices that are not mentioned above. By way of example, the processing unit 10 may be equipped with an exhaust device for exhausting the gas from the processing chamber 23, and a liquid draining device for draining the liquid falling (scattered) from the substrate W from the inside of the processing chamber 23. Further, the processing unit 10 may be further equipped with a heating device configured to heat the liquid on the substrate W to accelerate the liquid processing of the substrate W.

Figure 3:
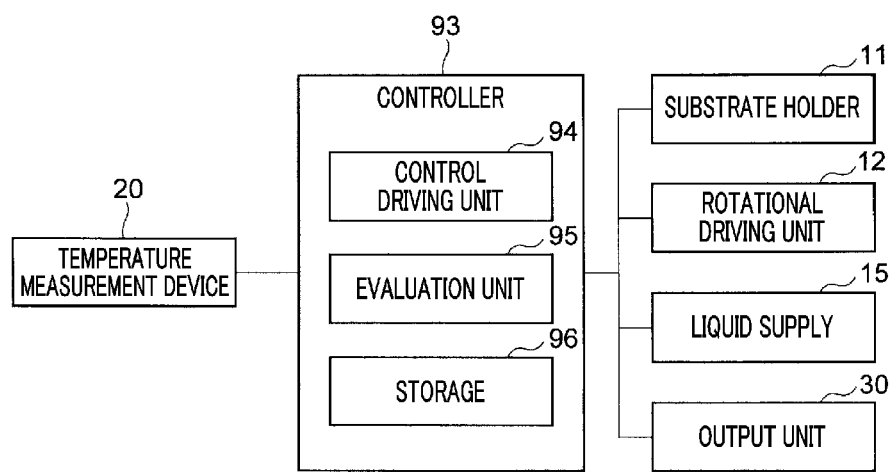
FIG. 3 is a block diagram illustrating an example of a functional configuration of a controller.

FIG. 3 is a block diagram illustrating an example of a functional configuration of the controller 93. Each block (particularly, each block belonging to the controller 93) shown in FIG. 3 may be implemented by hardware and/or software, or may be implemented by a single device or a combination of two or more devices. Further, two or more blocks shown in FIG. 3 may be implemented by a single device in common.

The controller 93 is connected with, for example, the substrate holder 11, the rotational driving unit 12, the liquid supply 15, the temperature measurement device 20 and an output unit 30. The controller 93 includes a control driving unit 94 configured to control operations of the various kinds of devices connected to the controller 93, an evaluation unit 95 configured to derive discharge position deviation information to be described later, and a storage 96 in which various kinds of data and programs are stored.

The control driving unit 94 controls the substrate holder 11 to hold the substrate W or release the holding of the substrate W. Further, the control driving unit 94 controls the rotational driving unit 12 to rotate the substrate holder 11 and the substrate W held by the substrate holder 11. Further, the control driving unit 94 controls the liquid supply 15 to move the liquid discharge nozzle 19 or discharge the liquid from the liquid discharge nozzle 19. Further, the temperature measurement device 20 sends the measurement result to the controller 93. The evaluation unit 95 derives the discharge position deviation information based on the measurement result sent from the temperature measurement device 20. The derived discharge position deviation information may be used to revise and/or add the data and/or the programs stored in the storage 96, and may be sent to the output unit 30 to be outputted in the form of an image and/or a sound by the output unit 30.

[Deriving of Discharge Position Deviation Information]

Now, a typical example of a method of deriving the discharge position deviation information will be explained.

Figure 4:
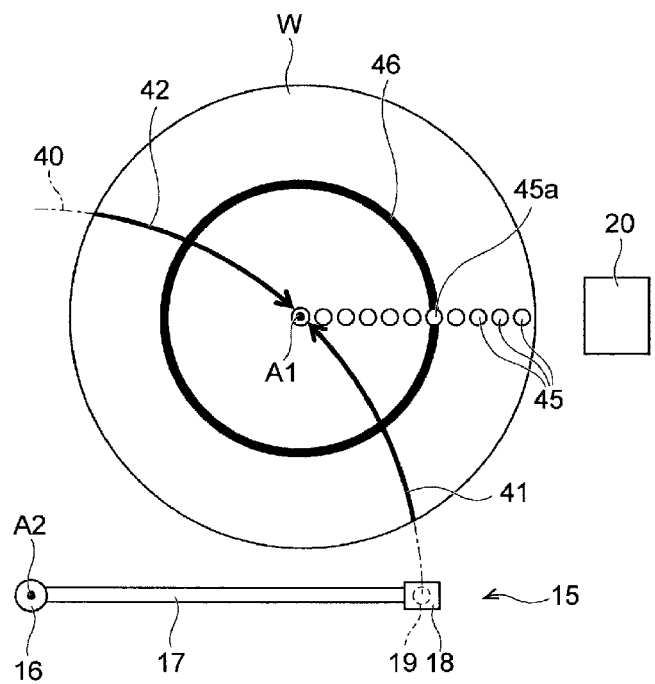
FIG. 4 is a top view illustrating an example of a substrate held by a substrate holder.

FIG. 4 is a top view illustrating an example of the substrate W held by the substrate holder 11. In FIG. 4, various kinds of components are illustrated in a simplified manner to ease understanding of the description, and illustration of the cup body 21, the inert gas supply 22, and so forth is omitted.

The control driving unit 94 of the controller 93 controls the liquid supply 15 to discharge the liquid toward the surface of the substrate W from the liquid discharge nozzle 19 while moving the liquid discharge nozzle 19. Accordingly, a landing position of the liquid on the surface of the substrate W is continuously changed. To elaborate, the control driving unit 94 discharges the liquid from the liquid discharge nozzle 19 directly downwards (that is, in a vertical direction) while moving the liquid discharge nozzle 19 along a first nozzle path 41 and a second nozzle path 42, which are different from each other, above the surface of the substrate W. At this time, the liquid discharged from the liquid discharge nozzle 19 has the temperature different from the temperature of the substrate W (typically, the temperature of the atmosphere within the processing chamber 23). Accordingly, as this liquid lands on the substrate W, the temperature of the substrate W gradually changes.

The liquid discharge nozzle 19 according to the present exemplary embodiment is configured to be moved back and forth along a circular arc-shaped movement trajectory 40 centered on the revolving axis A2. A path through which the liquid discharge nozzle 19 is moved from one side of the movement trajectory 40 to the other side thereof along the movement trajectory 40 corresponds to the first nozzle path 41, and a path through which the liquid discharge nozzle 19 is moved from the other side of the movement trajectory 40 to the one side thereof along the movement trajectory 40 corresponds to the second nozzle path 42. In the shown example, the movement trajectory 40 passes the rotation axis A1. Thus, a path through which the liquid discharge nozzle 19 is moved from the one side of the movement trajectory 40 toward the rotation axis A1 along the movement trajectory 40 corresponds to the first nozzle path 41, and a path through which the liquid discharge nozzle 19 is moved from the other side of the movement trajectory 40 toward the rotation axis A1 along the movement trajectory 40 corresponds to the second nozzle path 42. The liquid discharge nozzle 19 discharges the liquid while being moved along the first nozzle path 41 and the second nozzle path 42 in the state that the rotation of the substrate W held by the substrate holder 11 is carried on.

While the liquid discharge nozzle 19 is discharging the liquid toward the substrate W while being moved, the temperature measurement device 20 measures a spot temperature of a specific spot 45a of the substrate W (that is, a part of the substrate W) continuously, and sends measurement results to the controller 93.

The temperature measurement device 20 in the shown example is capable of measuring the temperature of the surface of the substrate W itself or the temperature of the liquid on the surface of the substrate W at multiple temperature measurement spots 45 on the top surface of the substrate W. The specific spot 45a is one of these multiple temperature measurement spots 45. The specific spot 45a is typically located between an edge of the substrate W and the rotation axis A1. The liquid continuously discharged onto the surface of the substrate W from the liquid discharge nozzle 19 in the state that the substrate W is being rotated keeps on landing on an annular region on the surface of the substrate W which is equi-distanced from the rotation axis A1. That is, since the substrate W is being rotated at a very high speed as compared to a moving speed of the liquid discharge nozzle 19, the liquid discharged from the liquid discharge nozzle 19 is resultantly provided onto the annular region on the top surface of the substrate W which is formed in a circumferential direction around the rotation axis A1. The annular region of the surface of the substrate W where a distance from the rotation axis A1 is equal to a distance between the rotation axis A1 and the specific spot 45a is referred to as a "specific annular region 46."

The evaluation unit 95 of the controller 93 acquires first temperature information based on the spot temperature measured by the temperature measurement device 20 when the liquid discharge nozzle 19 is moved along the first nozzle path 41. Further, the evaluation unit 95 acquires second temperature information based on the spot temperature measured by the temperature measurement device 20 when the liquid discharge nozzle 19 is moved along the second nozzle path 42. The first temperature information and the second temperature information are based on the measurement results of the spot temperature which are obtained by continuously changing the landing position of the liquid on the surface of the substrate W while rotating the substrate W.

When acquiring the first temperature information, a trajectory of the landing position of the liquid, which is discharged from the liquid discharge nozzle 19 being moved along the first nozzle path 41, on the surface of the substrate W passes the specific annular region 46 on the surface of the substrate W. Likewise, a trajectory of the landing position of the liquid, which is discharged from the liquid discharge nozzle 19 being moved along the second nozzle path 42, on the surface of the substrate W passes the specific annular region 46.

The evaluation unit 95 derives the discharge position deviation information of the liquid supply 15 by comparing the first temperature information and the second temperature information obtained as stated above. Here, the discharge position deviation information is information regarding a deviation of the landing position of the liquid discharged from the liquid discharge nozzle 19 on the surface of the substrate W, and is calculated based on the first temperature information and the second temperature information. Typically, the discharge position deviation information may include information upon a deviation of a movement position of the driving arm 17, information upon a pipeline error of the liquid supply line connected to the liquid discharge nozzle 19, and information upon a deviation of a discharge direction of the liquid from the liquid discharge nozzle 19. Typical examples of these information that can be included in the discharge position deviation information will be described later.

The processing unit 10 and the controller 93 (that is, the substrate liquid processing apparatus) of the present exemplary embodiment having the above-described configuration performs a liquid discharge evaluation method including the following processes.

First, in the state that the substrate W is being rotated, the liquid having the temperature different from the temperature of the substrate W (that is, higher or lower than the temperature of the substrate W) is discharged from the liquid discharge nozzle 19 toward the surface (particularly, the top surface) of the substrate W while the liquid discharge nozzle 19 is being moved along the first nozzle path 41. Accordingly, the spot temperature, which is at least one of the temperature of the specific spot 45a of the surface of the substrate W or the temperature of the liquid on the specific spot 45a, is measured by the temperature measurement device 20 while the landing position of the liquid on the surface of the substrate W is being changed continuously. The measurement result of the temperature measurement device 20 obtained in this way is sent to the controller 93 as the first temperature information. Thus, the first temperature information is based on the spot temperature measured by the temperature measurement device 20 when the liquid discharge nozzle 19 is moved along the first nozzle path 41.

Then, in the state that the substrate W is being rotated, the liquid having the temperature different from the temperature of the substrate W is discharged from the liquid discharge nozzle 19 toward the surface (particularly, the top surface) of the substrate W while the liquid discharge nozzle 19 is being moved along the second nozzle path 42. Accordingly, the spot temperature, which is at least one of the temperature of the specific spot 45a of the surface of the substrate W or the temperature of the liquid on the specific spot 45a, is measured by the temperature measurement device 20 while the landing position of the liquid on the surface of the substrate W is being changed continuously. The measurement result of the temperature measurement device 20 obtained in this way is sent to the controller 93 as the second temperature information. Thus, the second temperature information is based on the spot temperature measured by the temperature measurement device 20 when the liquid discharge nozzle 19 is moved along the second nozzle path 42.

Further, before the liquid is discharged from the liquid discharge nozzle 19 onto the surface of the substrate W to acquire the second temperature information, the temperature of the substrate W is returned to the temperature of the atmosphere within the processing chamber 23. That is, after the first temperature information is acquired, the supply of the liquid onto the substrate W from the liquid discharge nozzle 19 is stopped, and the liquid is removed from the substrate W through a spin drying processing, so that the temperature of the substrate W is adjusted to be equal to the temperature of the atmosphere within the processing chamber 23. Then, the supply of the liquid onto the substrate W from the liquid discharge nozzle 19 is performed again to obtain the second temperature information. To ease comparison of the first temperature information and the second temperature information to be described later, it is desirable to obtain the first temperature information and the second temperature information under same conditions. By way of example, it is desirable that the moving speed of the liquid discharge nozzle 19, the temperature of the liquid discharged from the liquid discharge nozzle 19, the rotation speed of the substrate W, and so forth need to be same in the processing of acquiring the first temperature information and the processing of acquiring the second temperature information.

The controller 93 derives the discharge position deviation information by comparing the first temperature information obtained when the liquid discharge nozzle 19 is moved along the first nozzle path 41 and the second temperature information obtained when the liquid discharge nozzle 19 is moved along the second nozzle path 42. The discharge position deviation information obtained in this way can be used for various purposes. By way of example, the discharge position deviation information may be stored in the storage 96 as historical information, used to revise the data and/or the programs stored in the storage 96, or informed to a user through the output unit 30.

By way of example, based on the derived discharge position deviation information, the controller 93 (for example, the evaluation unit 95) may derive a deviation amount (hereinafter, referred to as "liquid landing deviation amount") of the landing position of the liquid discharged from the liquid discharge nozzle 19 upon the substrate W. In this case, the controller 93 (for example, the control driving unit 94) may control the driving of the liquid supply 15 to cancel the derived liquid landing deviation amount, thus allowing the liquid discharged from the liquid discharge nozzle 19 to land on a required position on the substrate W accurately. For example, if the controller 93 monitors the position of the liquid discharge nozzle 19 based on an output result of an encoder of the nozzle driving unit 16, the controller 93 may correct a relationship between the output of the encoder and the position of the liquid discharge nozzle 19 based on the discharge position deviation information.

[Typical Example of Discharge Position Deviation]

Landing of the liquid from the liquid discharge nozzle 19 on the position deviated from the required position of the substrate W (that is, "discharge position deviation") is caused for various reasons.

By way of example, the discharge position deviation may be caused in the liquid supply 15 due to insufficient accuracy in the installation position of the liquid discharge nozzle 19. In this case, the controller 93 (for example, the evaluation unit 95) may calculate a position deviation amount of the liquid discharge nozzle 19 from the discharge position deviation information, and adjust a driving amount of the liquid supply 15 (for example, the nozzle driving unit 16) based on the position deviation amount of the liquid discharge nozzle 19. Further, when necessary, the controller 93 may update the data and/or the programs stored in the storage 96 based on the position deviation amount of the liquid discharge nozzle 19. As stated, the discharge position deviation information obtained by the controller 93 may include the information upon the accuracy of the installation position of the liquid discharge nozzle 19.

Moreover, in case that the liquid supply 15 is equipped with multiple liquid discharge nozzles 19, the discharge position deviation of the liquid supply 15 may be caused due to a pipeline misconnection (pipeline error) between the multiple liquid discharge nozzles 19.

Figure 5:
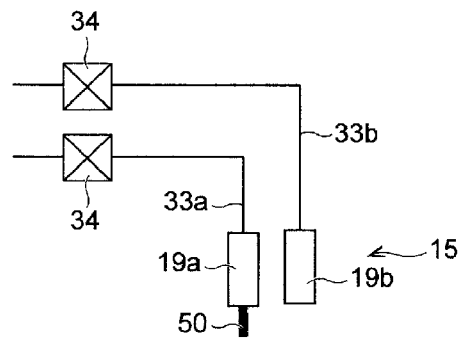
FIG. 5 is a schematic diagram for describing an example of a normal pipeline.
Figure 6:
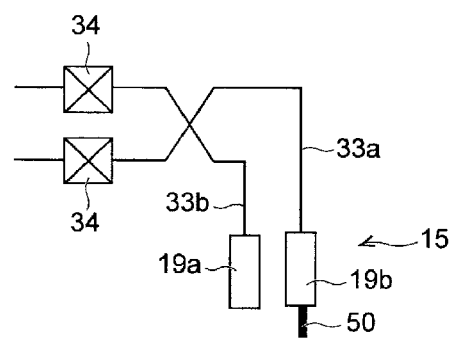
FIG. 6 is a schematic diagram for describing an example of a pipeline misconnection.

By way of example, assume that the liquid supply 15 is equipped with the first liquid discharge nozzle 19a and the second liquid discharge nozzle 19b, as shown in FIG. 5 and FIG. 6. In this case, if the pipeline connection is appropriately done, a first liquid supply line 33a is connected to the first liquid discharge nozzle 19a, and a second liquid supply line 33b is connected to the second liquid discharge nozzle 19b, as illustrated in FIG. 5. As depicted in FIG. 6, however, the second liquid supply line 33b may be wrongly connected to the first liquid discharge nozzle 19a, and the first liquid supply line 33a may be wrongly connected to the second liquid discharge nozzle 19b. For example, in case of discharging a liquid 50 from the first liquid discharge nozzle 19a as shown in FIG. 5, a supply valve 34 provided in the first liquid supply line 33a is opened, and a supply valve 34 provided in the second liquid supply line 33b is closed under the control of the controller 93 (particularly, the control driving unit 94). If, however, there is the pipeline error as shown in FIG. 6, the liquid 50 is not discharged from the first liquid discharge nozzle 19a, which is intended originally, but the liquid 50 is unintentionally discharged from the second liquid discharge nozzle 19b.

As stated above, the discharge position deviation information may include information upon the pipeline error between the liquid supply line connected to the first liquid discharge nozzle 19a and the liquid supply line connected to the second liquid discharge nozzle 19b. Further, a degree of the discharge position deviation (that is, a discharge position deviation amount) caused by the wrong pipeline connection corresponds to a distance between the liquid discharge nozzles 19. Thus, based on the specific discharge position deviation amount calculated from the discharge position deviation information, the controller 93 (for example, the evaluation unit 95) is capable of making a determination upon whether or not the discharge position deviation caused by the pipeline error has occurred.

Figure 7:
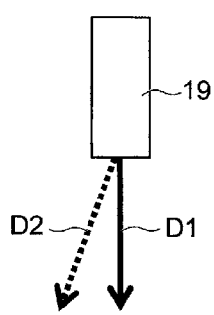
FIG. 7 is a schematic diagram for describing an example of a discharge abnormality of a liquid discharge nozzle.

Furthermore, the discharge position deviation may also be caused when the discharge direction of the liquid 50 from the liquid discharge nozzle 19 is not appropriate. It is ideal if a direction in which the liquid 50 is discharged from the liquid discharge nozzle 19 coincides with an originally intended discharge direction (see a discharge direction indicated by a notation D1 in FIG. 7). Actually, however, the direction in which the liquid 50 is discharged from the liquid discharge nozzle 19 may be deviated from the originally intended discharge direction (see a discharge direction indicated by a notation D2 in FIG. 7) due to lack of the processing accuracy or the installation accuracy of the liquid discharge nozzle 19. As stated, the discharge position deviation information may include information upon the deviation of the discharge direction of the liquid from the liquid discharge nozzle 19.

[Example of Calculation of Discharge Position Deviation Amount]

Now, a specific example of a method of calculating the discharge position deviation amount will be described. In the following example, the moving speed of the liquid discharge nozzle 19 centered on the revolving axis A2 is set to be constant regardless of which nozzle path (that is, the first nozzle path 41 and the second nozzle path 42) is taken.

Figure 8:
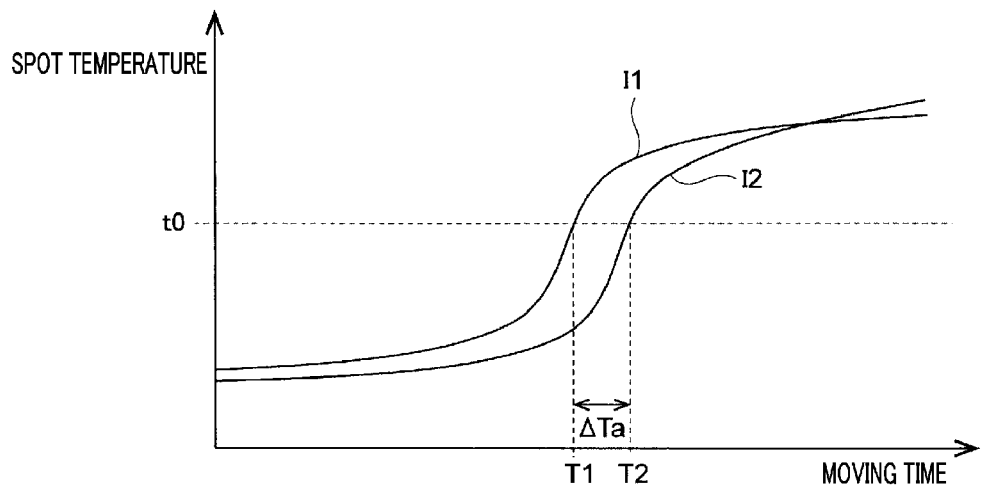
FIG. 8 is a graph for describing an example method of calculating a discharge position deviation amount.

FIG. 8 is a graph for describing an example of the method of calculating the discharge position deviation amount. In FIG. 8, a horizontal axis represents a time (hereinafter, referred to as "moving time") during which the liquid discharge nozzle 19 is moved from the edge of the surface (particularly, the top surface) of the substrate W, and a vertical axis indicates a spot temperature measured by the temperature measurement device 20. The moving time shown in FIG. 8 is counted starting from a time when the liquid discharge nozzle 19 reaches a position where the liquid discharged from the liquid discharge nozzle 19 is expected to reach the edge of the surface of the substrate W. Accordingly, when it is intended to discharge the liquid from the liquid discharge nozzle 19 directly downwards (that is, in the vertical direction), a time when the liquid discharge nozzle 19 reaches a position where it is overlapped with the edge of the top surface of the substrate W in the vertical direction is regarded as a starting point of the moving time shown in FIG. 8.

Each of the aforementioned first temperature information and second temperature information may include time-dependent temperature information which is set based on the moving time of the liquid discharge nozzle 19 from the edge of the surface of the substrate W and the spot temperature measured by the temperature measurement device 20. In FIG. 8, the time-dependent temperature information included in the first temperature information (that is, "first time-dependent temperature information") is assigned a reference numeral 11, and the time-dependent temperature information included in the second temperature information (that is, "second time-dependent temperature information") is assigned a reference numeral 12.

The controller 93 (particularly, the evaluation unit 95) is capable of deriving the discharge position deviation information by comparing a moving time T1 corresponding to a threshold temperature t0 in the first time-dependent temperature information I1 and a moving time T2 corresponding to the threshold temperature t0 in the second time-dependent temperature information I2.

It is desirable that the threshold temperature t0 is decided based on the spot temperature which can be varied to reach by being affected by the liquid discharged from the liquid discharge nozzle 19. As an example, a spot temperature that can reach at a timing when the liquid discharged from the liquid discharge nozzle 19 lands on the specific annular region 46 or immediately before or immediately after the timing may be used as the threshold temperature t0. Here, "the timing when the liquid discharged from the liquid discharge nozzle 19 lands on the specific annular region 46" may be a timing when the liquid discharge nozzle 19 crosses a space over the specific annular region 46 when the liquid is discharged directly downwards from the liquid discharge nozzle 19.

The threshold temperature t0 may be a predetermined value, or a value adaptively set based on the actually acquired first time-dependent temperature information I1 and second time-dependent temperature information I2. As an example, the threshold temperature t0 may be set based on a differential coefficient of the spot temperature of the first time-dependent temperature information I1 with respect to the moving time, and a differential coefficient of the spot temperature of the second time-dependent temperature information I2 with respect to the moving time. By way of example, the threshold temperature t0 may be set based on "a spot temperature at which the differential coefficient of the spot temperature with respect to the moving time is of a maximum value" in the first time-dependent temperature information I1 and the second time-dependent temperature information I2.

For example, in case that the liquid supply 15 is placed in an ideal state in which there is no discharge position deviation, the moving time taken before the liquid discharge nozzle 19 arrives at the space above the specific annular region 46 starting from the edge of the top surface of the substrate W is constant regardless of which nozzle path is taken. Thus, in this case, the "moving time of the liquid discharge nozzle 19" and the "spot temperature" show substantially same behaviors between the first time-dependent temperature information I1 and the second time-dependent temperature information I2. To be specific, the moving time T1 corresponding to the threshold temperature t0 in the first time-dependent temperature information I1 and the moving time T2 corresponding to the threshold temperature t0 in the second time-dependent temperature information I2 are same or almost same.

Meanwhile, when the discharge position deviation is caused in the liquid supply 15, there is generated a difference, between the first nozzle path 41 and the second nozzle path 42, in the moving time taken before the liquid discharge nozzle 19 reaches the space above the specific annular region 46 from the edge of the top surface of the substrate W. The controller 93 is capable of deriving the discharge position deviation amount from this difference in the moving time (that is, the difference in the moving time between the first nozzle path 41 and the second nozzle path 42).

For example, the controller 93 is capable of calculating, from the measurement result of the temperature measurement device 20, a difference between the moving time T1 corresponding to the threshold temperature t0 in the first time-dependent temperature information I1 and the moving time T2 corresponding to the threshold temperature t0 in the second time-dependent temperature information I2. This difference (i.e., "T2−T1") in the moving time is referred to as a "moving time difference $\Delta Ta$" (see FIG. 8). The controller 93 may output a value obtained by multiplying the moving speed of the liquid discharge nozzle 19 to ½ of this moving time difference $\Delta Ta$ (i.e., $\Delta Ta/2$) as "a position deviation amount of the liquid discharge nozzle 19 in a direction according to the movement trajectory 40." In this way, the controller 93 is capable of calculating the discharge position deviation amount directly.

In addition, the controller 93 is capable of calculating a ½ of a sum of the moving time T1 corresponding to the threshold temperature t0 in the first time-dependent temperature information I1 and the moving time T2 corresponding to the threshold temperature t0 in the second time-dependent temperature information I2 (i.e., (T1+T2)/2). Here, this value of (T1+T2)/2 corresponds to "a moving time of the liquid discharge nozzle 19 from the edge of the surface of the substrate W" at a timing when the liquid discharge nozzle 19 passes a center position on the movement trajectory 40. In the example shown in FIG. 4, a position on the movement trajectory 40 where the rotation axis A1 passes corresponds to "the center position on the movement trajectory 40." Furthermore, in the controller 93, a value obtained by multiplying the moving speed of the liquid discharge nozzle 19 to (T1+T2)/2 may be calculated as "a distance from the edge of the top surface of the substrate W to the center position on the movement trajectory 40 along the movement trajectory 40." In this way, the controller 93 is capable of calculating the discharge position deviation amount indirectly as well.

Based on the discharge position deviation amount calculated directly and/or indirectly as stated above, the controller 93 is capable of performing optimization of a program and data for movement control of the liquid discharge nozzle 19. Accordingly, the liquid discharged from the liquid discharge nozzle 19 is allowed to land on the required position on the substrate W with high accuracy.

Figure 9:
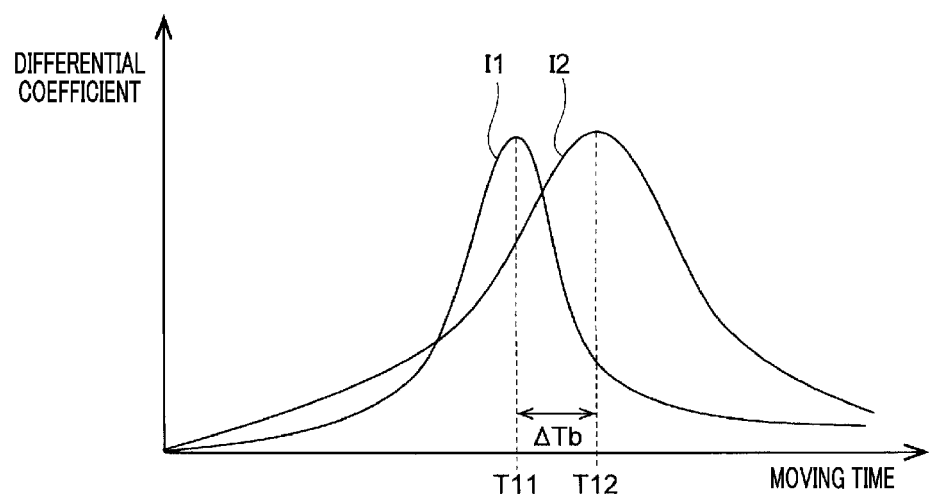
FIG. 9 is a graph for describing another example method of calculating a discharge position deviation amount.

FIG. 9 is a graph for describing another method of calculating the discharge position deviation amount. In FIG. 9, a horizontal axis indicates the moving time of the liquid discharge nozzle 19 from the edge of the top surface of the substrate W, and a vertical axis represents a differential coefficient of the spot temperature with respect to the moving time. Further, the moving time in FIG. 9 has the same definition as the moving time in the above-described FIG. 8.

The controller 93 may acquire a first reference moving time T11 which is set based on the differential coefficient of the spot temperature of the first time-dependent temperature information I1 with respect to the moving time. Further, the controller 93 may acquire a second reference moving time T12 which is set based on the differential coefficient of the spot temperature of the second time-dependent temperature information I2 with respect to the moving time. Then, the controller 93 may derive the discharge position deviation information by comparing the first reference moving time T11 and the second reference moving time T12.

By way of example, in case that the liquid supply 15 is placed in the ideal state in which there is no discharge position deviation, the "moving time of the liquid discharge nozzle 19" and the "spot temperature" show very similar behaviors between the first time-dependent temperature information I1 and the second time-dependent temperature information I2. Accordingly, the differential coefficient of the spot temperature with respect to the moving time also shows a very similar behavior between the first time-dependent temperature information I1 and the second time-dependent temperature information I2. As a result, the moving time when the differential coefficient of the spot temperature with respect to the moving time is of a maximum value (that is, the first reference moving time T11 and the second reference moving time T12) may be same or almost same between the first time-dependent temperature information I1 and the second time-dependent temperature information I2.

Typically, it is deemed that "the moving time when the differential coefficient of the spot temperature with respect to the moving time is of the maximum value" is set based on the timing when the liquid discharged from the liquid discharge nozzle 19 lands on the specific annular region 46. For example, in case that the liquid is supposed to be discharged directly downwards from the liquid discharge nozzle 19, "the moving time when the differential coefficient of the spot temperature with respect to the moving time is of the maximum value" is deemed to be set based on a timing when the liquid discharge nozzle 19 crosses the space above the specific annular region 46.

For the reason, when the discharge position deviation occurs in the liquid supply 15, there is generated, between the first time-dependent temperature information I1 and the second time-dependent temperature information I2, a difference in the moving time when the differential coefficient of the spot temperature with respect to the moving time is of the maximum value. This difference in moving time (i.e., T12−T11) is referred to as "moving time difference ΔTb" (see FIG. 9). The controller 93 is capable of calculating this moving time difference ΔTb from the measurement result of the temperature measurement device 20. Further, the controller 93 may output a value obtained by multiplying the moving speed of the liquid discharge nozzle 19 to ΔTb/2 as "a position deviation amount of the liquid discharge nozzle 19 in the direction according to the movement trajectory 40." Further, the controller 93 is capable of outputting (T11+T12)/2 as "a moving time of the liquid discharge nozzle 19 from the edge of the surface of the substrate W" at the timing when the liquid discharge nozzle 19 passes the center position on the movement trajectory 40. Moreover, the controller 93 may output a value obtained by multiplying the moving speed of the liquid discharge nozzle 19 to (T11+T12)/2 as "a distance from the edge of the top surface of the substrate W to the center position on the movement trajectory 40 along the movement trajectory 40." In this way, the controller 93 is capable of calculating the discharge position deviation amount directly and/or indirectly based on the comparison of the first reference moving time T11 and the second reference moving time T12.

According to the substrate liquid processing apparatus and the liquid discharge evaluation method as described above, the information upon the discharge position deviation that may be caused in the liquid supply 15 configured to supply the liquid onto the substrate W can be obtained.

In general, a position adjustment of the liquid discharge nozzle 19 may be usually performed manually. By way of example, when starting the substrate liquid processing apparatus or replacing the liquid discharge nozzle 19, the position of the liquid discharge nozzle 19 may be adjusted by a user, when necessary. In this adjustment method performed manually by the user, the position of the liquid discharge nozzle 19 may not always be adjusted accurately, and an error such as a pipeline misconnection caused by a mistake of the user may occur accidently. Further, in the manual adjustment method performed by the user, the position adjustment of the liquid discharge nozzle 19 may be performed only at limited timings as performing it frequently imposes a big burden on the user. In this case, however, it is difficult to promptly cope with the discharge position deviation which is caused accidently due to a defect in a part or the like.

Meanwhile, according to the substrate liquid processing apparatus and the liquid discharge evaluation method described above, the information upon the discharge position deviation is obtained without needing the manual work of the user, and the optimization of the movement control over the liquid discharge nozzle 19 can also be carried out without the manual work of the user. Therefore, the simple or highly accurate movement control over the liquid discharge nozzle 19 can be carried out based on the highly reliable information upon the discharge position deviation.

Modification Examples

There may be only one specific spot 45a on the substrate W (see FIG. 4), or multiple specific spots 45a spaced apart from each other may exist. That is, the spot temperature measured by the temperature measurement device 20 may be based on the measurement temperature obtained for the single specific spot 45a on the substrate W or the measurement temperatures obtained for the multiple specific spots 45a on the substrate W. The spot temperature based on the multiple specific spots 45a may be an average value of the spot temperatures respectively obtained from the multiple specific spots 45a. Alternatively, the spot temperature may be a sum of values obtained by multiplying an intrinsic coefficient to the spot temperatures acquired from the individual specific spots 45a.

The movement trajectory 40 of the liquid discharge nozzle 19 is not limited to the example shown in FIG. 4. For example, the movement trajectory 40 may not cross the rotation axis A1 and may have a shape other than the circular arc shape.

It should be noted that the above-described exemplary embodiment is illustrative in all aspects and is not anyway limiting. The above-described exemplary embodiment may be omitted, replaced and modified in various ways without departing from the scope and the spirit of claims. By way of example, the exemplary embodiments and the modification examples described above may be combined with each other, or an exemplary embodiment other than those described in the preset disclosure may be combined with the above-described exemplary embodiments or modification examples.

Furthermore, a technical category for embodying the above-described technical concept is not particularly limited. By way of example, the above-described substrate liquid processing apparatus may be applied to another apparatus. Moreover, the above-described technical concept may be embodied by a computer-executable program for executing one or multiple sequences (processes) included in the above-described liquid discharge evaluation method on a computer. Further, the above-described technical concept may be embodied by a computer-readable non-transitory recording medium in which such a computer-executable program is stored.

According to the exemplary embodiment, it is possible to acquire the information upon the discharge position deviation which is caused in the liquid supply configured to supply the liquid onto the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
a substrate holder configured to hold a substrate;
a rotating device configured to rotate the substrate around a rotation axis;
a liquid supply equipped with a first liquid discharge nozzle configured to discharge a liquid having a temperature different from a temperature of the substrate, and also equipped with a nozzle moving device configured to move the first liquid discharge nozzle;
a temperature measurement device configured to measure a spot temperature which is at least one of a temperature of a specific spot on a surface of the substrate or a temperature of the liquid on the specific spot; and
a controller configured to control the liquid supply to change a landing position of the liquid on the surface of the substrate continuously by discharging the liquid toward the surface of the substrate from the first liquid discharge nozzle while moving the first liquid discharge nozzle, the controller being also configured to derive a deviation of the landing position of the liquid discharged from the first liquid discharge nozzle on the surface of the substrate by comparing first temperature information based on the spot temperature measured by the temperature measurement device when the first liquid discharge nozzle is moved along a first nozzle path with second temperature information based on the spot temperature measured by the temperature measurement device when the first liquid discharge nozzle is moved along a second nozzle path which is different from the first nozzle path.

2. The substrate liquid processing apparatus of claim 1, wherein the first temperature information and the second temperature information are based on measurement results of the spot temperature obtained by continuously changing the landing position of the liquid on the surface of the substrate while rotating the substrate,
when the first temperature information is acquired, a trajectory of the landing position of the liquid discharged from the first liquid discharge nozzle moved along the first nozzle path on the surface of the substrate passes a specific annular region of the surface of the substrate, the specific annular region being a region where a distance from the rotation axis is equal to a distance between the rotation axis and the specific spot, and
when the second temperature information is acquired, a trajectory of the landing position of the liquid discharged from the first liquid discharge nozzle moved along the second nozzle path on the surface of the substrate passes the specific annular region.

3. The substrate liquid processing apparatus of claim 2, wherein the first liquid discharge nozzle is moved along a circular arc-shaped movement trajectory,
the first nozzle path is a path from a first side of the movement trajectory toward a second side thereof along the movement trajectory, and
the second nozzle path is a path from the second side of the movement trajectory toward the first side thereof along the movement trajectory.

4. The substrate liquid processing apparatus of claim 2, wherein the nozzle moving device comprises a driving arm configured to be moved along with the first liquid discharge nozzle, and
the deviation of the landing position of the liquid includes information upon a deviation of a movement position of the driving arm.

5. The substrate liquid processing apparatus of claim 2, wherein the liquid supply comprises a second liquid discharge nozzle, and
the deviation of the landing position of the liquid includes information upon a pipeline error between a liquid supply line connected to the first liquid discharge nozzle and a liquid supply line connected to the second liquid discharge nozzle.

6. The substrate liquid processing apparatus of claim 2, wherein the deviation of the landing position of the liquid includes information upon a deviation of a discharge direction of the liquid from the first liquid discharge nozzle.

7. The substrate liquid processing apparatus of claim 2, wherein each of the first temperature information and the second temperature information includes time-dependent temperature information set based on a moving time of the first liquid discharge nozzle from an edge of the surface of the substrate and the spot temperature measured by the temperature measurement device, and
the controller derives the deviation of the landing position of the liquid by comparing the moving time corresponding to a threshold temperature in the time-dependent temperature information of the first temperature information with the moving time corresponding to the threshold temperature in the time-dependent temperature information of the second temperature information.

8. The substrate liquid processing apparatus of claim 2, wherein each of the first temperature information and the second temperature information includes time-dependent temperature information set based on a moving time of the first liquid discharge nozzle from an edge of the surface of the substrate and the spot temperature measured by the temperature measurement device, and the controller derives the deviation of the landing position of the liquid by comparing a first reference moving time set based on a differential coefficient of the spot temperature of the time-dependent temperature information of the first temperature information with respect to the moving time with a second reference moving time set based on a differential coefficient of the spot temperature of the time-dependent temperature information of the second temperature information with respect to the moving time.

9. The substrate liquid processing apparatus of claim 1, wherein the first liquid discharge nozzle is moved along a circular arc-shaped movement trajectory,
the first nozzle path is a path from a first side of the movement trajectory toward a second side thereof along the movement trajectory, and
the second nozzle path is a path from the second side of the movement trajectory toward the first side thereof along the movement trajectory.

10. The substrate liquid processing apparatus of claim 1, wherein the nozzle moving device comprises a driving arm configured to be moved along with the first liquid discharge nozzle, and
the deviation of the landing position of the liquid includes information upon a deviation of a movement position of the driving arm.

11. The substrate liquid processing apparatus of claim 1, wherein the liquid supply comprises a second liquid discharge nozzle, and
the deviation of the landing position of the liquid includes information upon a pipeline error between a liquid supply line connected to the first liquid discharge nozzle and a liquid supply line connected to the second liquid discharge nozzle.

12. The substrate liquid processing apparatus of claim 1, wherein the deviation of the landing position of the liquid includes information upon a deviation of a discharge direction of the liquid from the first liquid discharge nozzle.

13. The substrate liquid processing apparatus of claim 1, wherein each of the first temperature information and the second temperature information includes time-dependent temperature information set based on a moving time of the first liquid discharge nozzle from an edge of the surface of the substrate and the spot temperature measured by the temperature measurement device, and
the controller derives the deviation of the landing position of the liquid by comparing the moving time corresponding to a threshold temperature in the time-dependent temperature information of the first temperature information with the moving time corresponding to the threshold temperature in the time-dependent temperature information of the second temperature information.

14. The substrate liquid processing apparatus of claim 13, wherein the threshold temperature is set based on a differential coefficient of the spot temperature of the time-dependent temperature information of the first temperature information with respect to the moving time and a differential coefficient of the spot temperature of the time-dependent temperature information of the second temperature information with respect to the moving time.

15. The substrate liquid processing apparatus of claim 1, wherein each of the first temperature information and the second temperature information includes time-dependent temperature information set based on a moving time of the first liquid discharge nozzle from an edge of the surface of the substrate and the spot temperature measured by the temperature measurement device, and
the controller derives the deviation of the landing position of the liquid by comparing a first reference moving time set based on a differential coefficient of the spot temperature of the time-dependent temperature information of the first temperature information with respect to the moving time with a second reference moving time set based on a differential coefficient of the spot temperature of the time-dependent temperature information of the second temperature information with respect to the moving time.

16. A liquid discharge evaluation method, comprising:
measuring a spot temperature which is at least one of a temperature of a specific spot on a surface of a substrate or a temperature of a liquid on the specific spot while continuously changing a landing position of the liquid on the surface of the substrate by discharging the liquid from a first liquid discharge nozzle toward the surface of the substrate while moving the first liquid discharge nozzle along a first nozzle path;
measuring the spot temperature while continuously changing the landing position of the liquid on the surface of the substrate by discharging the liquid from the first liquid discharge nozzle toward the surface of the substrate while moving the first liquid discharge nozzle along a second nozzle path which is different from the first nozzle path; and
deriving a deviation of the landing position of the liquid discharged from the first liquid discharge nozzle on the surface of the substrate by comparing first temperature information based on the spot temperature measured when the first liquid discharge nozzle is moved along the first nozzle path with second temperature information based on the spot temperature measured when the first liquid discharge nozzle is moved along the second nozzle path.

* * * * *